(12) United States Patent
Kao et al.

(10) Patent No.: US 11,387,167 B2
(45) Date of Patent: Jul. 12, 2022

(54) SEMICONDUCTOR STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Min-Feng Kao, Chiayi (TW);
Dun-Nian Yaung, Taipei (TW);
Jen-Cheng Liu, Hsin-Chu (TW);
Ching-Chun Wang, Tainan (TW);
Kuan-Chieh Huang, Hsinchu (TW);
Hsing-Chih Lin, Tainan (TW); Yi-Shin Chu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 28 days.

(21) Appl. No.: 16/920,430

(22) Filed: Jul. 3, 2020

(65) Prior Publication Data
US 2020/0335427 A1 Oct. 22, 2020

Related U.S. Application Data

(63) Continuation of application No. 16/228,585, filed on Dec. 20, 2018, now Pat. No. 10,727,164, which is a
(Continued)

(51) Int. Cl.
*H01L 23/52* (2006.01)
*H01L 23/48* (2006.01)
(Continued)

(52) U.S. Cl.
CPC ...... *H01L 23/481* (2013.01); *H01L 21/02697* (2013.01); *H01L 21/486* (2013.01); *H01L 21/76898* (2013.01); *H01L 23/522* (2013.01)

(58) Field of Classification Search
CPC ............. H01L 21/486; H01L 21/76898; H01L 21/02697; H01L 23/522; H01L 23/481
(Continued)

(56) References Cited

U.S. PATENT DOCUMENTS 8,008,778 B2 8/2011 Enda
9,666,520 B2 * 5/2017 Yu ..................... H01L 23/49827
(Continued)

OTHER PUBLICATIONS

Notice of Allowance and its translation dated Jul. 30, 2021 for counterpart Korean application 10-2018-0130913.

*Primary Examiner* — Luan C Thai
(74) *Attorney, Agent, or Firm* — WPAT Law; Anthony King

(57) ABSTRACT

Present disclosure provides a semiconductor structure, including a semiconductor substrate, a first metal layer, and a through substrate via (TSV). The semiconductor substrate has an active side. The first metal layer is closest to the active side of the semiconductor substrate, and the first metal layer has a first continuous metal feature. The TSV is extending from the semiconductor substrate to the first continuous metal feature. A width of the TSV at the first metal layer is wider than a width of the first continuous metal feature. Present disclosure also provides a method for manufacturing the semiconductor structure described herein.

20 Claims, 14 Drawing Sheets

Related U.S. Application Data continuation of application No. 15/841,945, filed on Dec. 14, 2017, now Pat. No. 10,163,758.

(60) Provisional application No. 62/579,030, filed on Oct. 30, 2017.

(51) Int. Cl.
| | | |
|---|---|---|
| *H01L 21/48* | (2006.01) | |
| *H01L 21/02* | (2006.01) | |
| *H01L 23/522* | (2006.01) | |
| *H01L 21/768* | (2006.01) | |

(58) Field of Classification Search
USPC .......................................................... 257/773
See application file for complete search history.

(56) References Cited

U.S. PATENT DOCUMENTS

| | | | |
|---|---|---|---|
| 9,754,918 B2* | 9/2017 | Yu | H01L 23/5384 |
| 10,629,643 B2* | 4/2020 | Kim | H01L 27/14621 |
| 2011/0049674 A1 | 3/2011 | Booth, Jr. et al. | |
| 2015/0060967 A1 | 3/2015 | Yokoyama et al. | |
| 2016/0351441 A1 | 12/2016 | Tsukiyama et al. | |

* cited by examiner

SEMICONDUCTOR STRUCTURE AND MANUFACTURING METHOD FOR THE SAME

CROSS REFERENCE TO RELATED APPLICATIONS

This application claims the benefit of prior-filed provisional application with application No. 62/579,030, filed Oct. 30, 2017, the benefit of prior-filed non-provisional application with application Ser. No. 15/841,945, filed Dec. 14, 2017, and the benefit of prior-filed non-provisional application with application Ser. No. 16/228,585, filed Dec. 20, 2018.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, conductive elements may be formed to provide electrical interconnections for the various components for an IC. For example, conductive vias for interconnecting different metal layers may be formed by etching openings in an interlayer dielectric (ILD) and filling the openings with a conductive material. However, as semiconductor fabrication technology nodes continue to evolve, critical dimensions and pitches are becoming smaller and smaller, and the process windows are becoming tighter. Consequently, overlay errors (e.g., misaligned via) may occur, which may lead to problems such as reduced reliability test margin or poor device performance.

Therefore, while conventional via formation processes have been generally adequate for their intended purposes, they have not been entirely satisfactory in every aspect.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION OF THE DISCLOSURE

Figure 1:
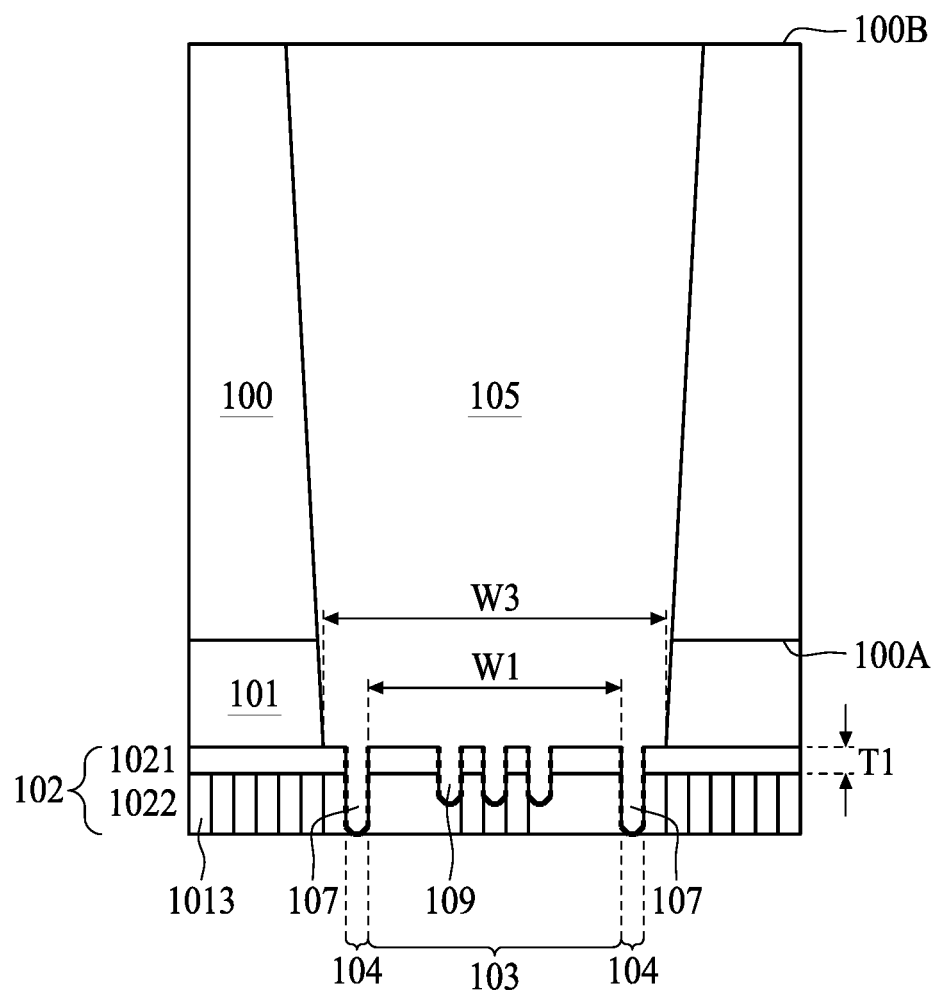
FIG. 1 is a cross sectional view showing an interconnect of a semiconductor structure, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As a part of semiconductor fabrication, electrical interconnections need to be 3o formed to electrically interconnect the various microelectronic elements (e.g., source/ drain, gate, etc.) of the semiconductor device. Generally, this involves forming openings in layers (such as in electrically insulating layers), and subsequently filling these openings with an electrically conductive material. The electrically conductive material is then polished to form the electrical interconnections such as metal lines or vias.

However, as semiconductor technology generations continue the scaling-down process, accurate alignment or overlay may become problematic due to the ever-decreasing trench sizes. For example, it may be more difficult for vias to be accurately aligned with the desired metal lines above or below. When via misalignment or overlay problems occur, conventional methods of fabrication may lead to undesirable over-etching of a dielectric material (e.g., ILD) below the via opening. When the via opening is later filled with a metal material, its shapes resembles a tiger tooth. Such "tiger tooth" vias may lead to poor device performance. Tighter process windows may need to be used to avoid these problems, but that may degrade device performance as well.

On the other hand, with the ever-decreasing technology node, different interconnect components shrink at different rate. For example, in technology node greater than or equal to 20 Nth metal (N20 and above), a through silicon via (TSV) having a width about or greater than 2.4 micrometer is in contact with the metal lines of a first metal layer. As described herein, the first metal layer is the first metal line layer in the back-end-of-line operation. Conventionally, a thickness of the first metal layer is greater than 1.5 µm, and a top view pattern of the first metal layer is solid without dielectric features. However, when advancing the technology node to sub 20 nm (N16 or N7), the width of the TSV remains substantially the same but the thickens of the first metal layer decreases to about 0.8 µm with an additional design rule of having a dimension of continuous metal feature in the first metal layer no greater than 2 µm. The continuous metal feature is defined by a particular metal area without any interruption, or cutting off, by materials other than metal, for example, dielectrics (interlayer dielectric ILD or inter metal dielectric IMD). The measure of distance in that particular metal area is the dimension of continuous metal feature. Illustration of continuous metal feature is presented in following figures of this disclosure.

Clearly, in N16 or N7, a width of the TSV at the first metal layer (e.g., 2.4 µm) is greater than the dimension of the continuous metal feature (e.g., 2 µm) in the first metal layer, hence, a first set of tiger tooth structure previously discussed occurs at the TSV/first metal layer interface. While the metal portion of the first metal layer functions as an etch stop with respect to the formation of TSV trench, the metal during TSV plating operation penetrates through the first metal layer at the boundary of the continuous metal feature as the etchant easily removes materials other than metal, for example, dielectrics. Moreover, with the reduced thickness of the first metal layer and the total thickness variation of the semiconductor substrate to be about 1 µm, the TSV trench etching operation could overetch the first metal layer and punch through the metal portion of the first metal layer, rendering the formation of a second set of tiger tooth structure. The extent of penetration for second set of tiger tooth structure may be less severe than that of the first set of tiger tooth structure. Illustration of the first set and the second set of tiger tooth structure are presented in following figures of this disclosure.

To mitigate the formation of tiger tooth structure which leads to various device performance concerns, such as signal damage due to TSV short with undesired metal layer, present disclosure proposes a novel structure and method utilizing the patterning of adjacent metal layers to enlarge the process window without sacrificing performance. The various aspects of the present disclosure will now be discussed in more detail with reference to FIGS. 1-14.

Referring to FIG. 1, FIG. 1 is a cross sectional view showing an interconnect of a semiconductor structure 10, in accordance with some embodiments of the present disclosure. The semiconductor structure 10 includes a substrate 100 having an active side 100A and a passive side 100B opposite to the active side 100A. Active components such as transistors and memories are formed in proximity to the active side 100A. In the technology node N14 and beyond, a total thickness variation (TTV) in the substrate 100 is about 1 µm. The existence of TTV is prone to impact the precision of subsequent etching operation of a through substrate trench, as will be further discussed in the manufacturing operations below. In some embodiments, the semiconductor substrate 100 includes silicon. Alternatively, the substrate 100 may include other elementary semiconductor such as germanium in accordance with some embodiments. In some embodiments, the substrate 100 additionally or alternatively includes a compound semiconductor such as silicon carbide, gallium arsenic, indium arsenide, and indium phosphide. In some embodiments, the substrate 100 includes an alloy semiconductor such as silicon germanium, silicon germanium carbide, gallium arsenic phosphide, and gallium indium phosphide.

The substrate 100 may include an epitaxial layer formed on the active side 100A, such as an epitaxial semiconductor layer overlying a bulk semiconductor wafer. In some embodiments, the substrate 100 includes a semiconductor-on-insulator (SOI) structure. For example, the substrate may include a buried oxide (BOX) layer formed by a process such as separation by implanted oxygen (SIMOX). In various embodiments, the substrate 100 includes various p-type doped regions and/or n-type doped regions, such as p-type wells, n-type wells, p-type source/drain features and/or n-type source/drain features, formed by a process such as ion implantation and/or diffusion. The substrate 100 may include other functional features such as a resistor, a capacitor, diode, transistors, such as field effect transistors (FETs). The substrate 100 may include lateral isolation features configured to separate various devices formed on the substrate 100. The substrate 100 may further include a portion of a multilayer interconnection (MLI) structure. The multilayer interconnection structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 100. The multilayer interconnection structure is designed to couple various devices features (such as various p-type and n-type doped regions, gate electrodes and/or passive devices) to form a functional circuit.

As shown in FIG. 1, an insulating layer 101 is disposed over the first side 100A and sandwiched between the substrate 100 and an interconnect layer 102. The interconnect layer 102 further includes a first metal layer 1021, a first via layer 1022, and dielectric 1013 surrounding the first metal layer 1021 and the first via layer 1022. In some embodiments, the insulating layer 101 is composed of the same materials as the dielectric 1013. In the N14 technology node, a thickness T1 of the first metal layer 1021 is lower than 1

μm, for example, 800 Angstrom, as compared to 1.5 μm in N20 and larger technology node.

Figure 6:
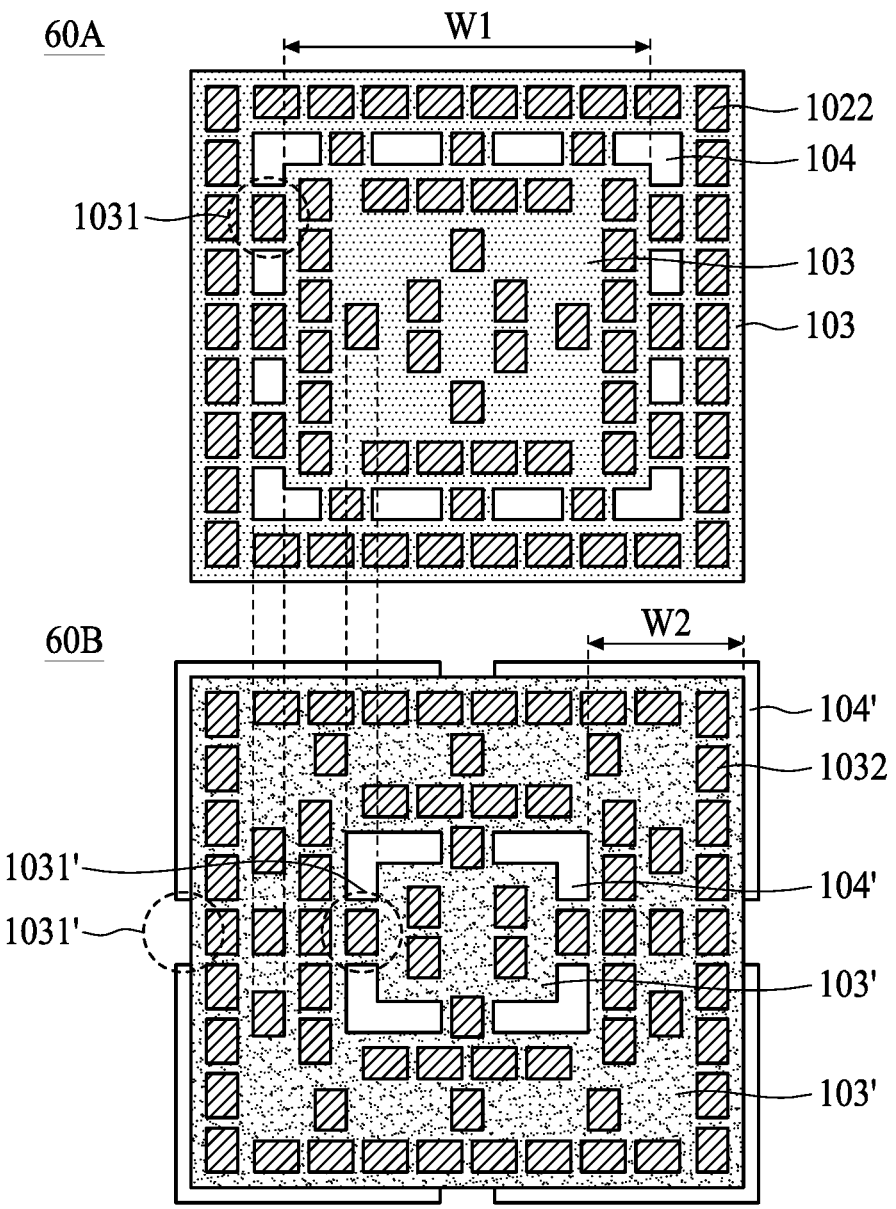
FIG. 6 is a top view showing an interconnect pattern structure of two adjacent layers, in accordance with some embodiments of the present disclosure.

With reference to the top view interconnect pattern 60A of the first metal layer 1021 in FIG. 6, a continuous metal feature 103 can be defined by a particular metal area without any interruption, or cutting off, by materials other than metal, for example, dielectrics (interlayer dielectric ILD or inter metal dielectric IMD). The measure of distance in that particular metal area is the dimension of continuous metal feature 103. As illustrated in FIG. 1 and FIG. 6, starting from a center of the interconnect pattern 60A toward the periphery of the pattern, the continuous metal feature 103 is cut off by a first dielectric feature 104, and a dimension of the continuous metal feature 103 can be a width W enclosed by the first dielectric feature 104. Referring back to FIG. 1, the dimension W1 of the continuous metal feature 103, in some embodiments, is less than 2 μm as far as technology node N14 is concerned. The dimension of the continuous metal feature is set as a design rule in metal pattern design. Metal layers following this rule shall obtain benefits from various design consideration including appropriate release of stress in the metal layer. As shown in the top view interconnect pattern 60A of the first metal layer 1021 in FIG. 6, the first dielectric feature 104 appears to have a broken band structure. Several metal bridges 1031 are connecting the continuous metal feature 103 inside the first dielectric feature 104 and the continuous metal feature 103 outside the first dielectric feature 104. Although not shown in the top view pattern 60A, the continuous metal feature outside the first dielectric feature 104 also follows the less than 2 μm design rule as discussed above.

Referring to FIG. 1, a through substrate via (TSV) 105 extends from a passive side 100B of the substrate 100 toward the active side 100A and further in contact with the first metal layer 1021. TSVs are typically formed in a semiconductor IC die to facilitate the formation of a three dimensional (3D) stacking die structure. The TSVs may be utilized to provide electrical connections between components in different dies of the 3D stacking die structure. As previously discussed, a width W3 of the TSV 105 does not shrink at the same pace as the interconnect layer 102, therefore, the width W3 is greater than the dimension W1 of the continuous metal feature 103 in technology node N14. For example, the width W3 can be equal to or greater than 2.4 μm, whereas the dimension W1 shall be smaller than 2 μm. The overlap region between the TSV 105 and the first metal layer 1021 is a hot spot for tiger tooth formation. Although may not appear in the final product, a first set of tiger tooth 107 penetrating the first dielectric feature 104 is illustrated with dotted lines in FIG. 1. In some embodiments, a second set of tiger tooth 109 penetrating the first metal layer 1021 within the continuous metal feature 103 is also illustrated with dotted lines in FIG. 1. People having ordinary skill in the art would understand that the tiger tooth 107, 109 are illustrated for demonstration purpose and is not intended to be a limitation in the final interconnect layer of the semiconductor structure 10.

Figure 2:
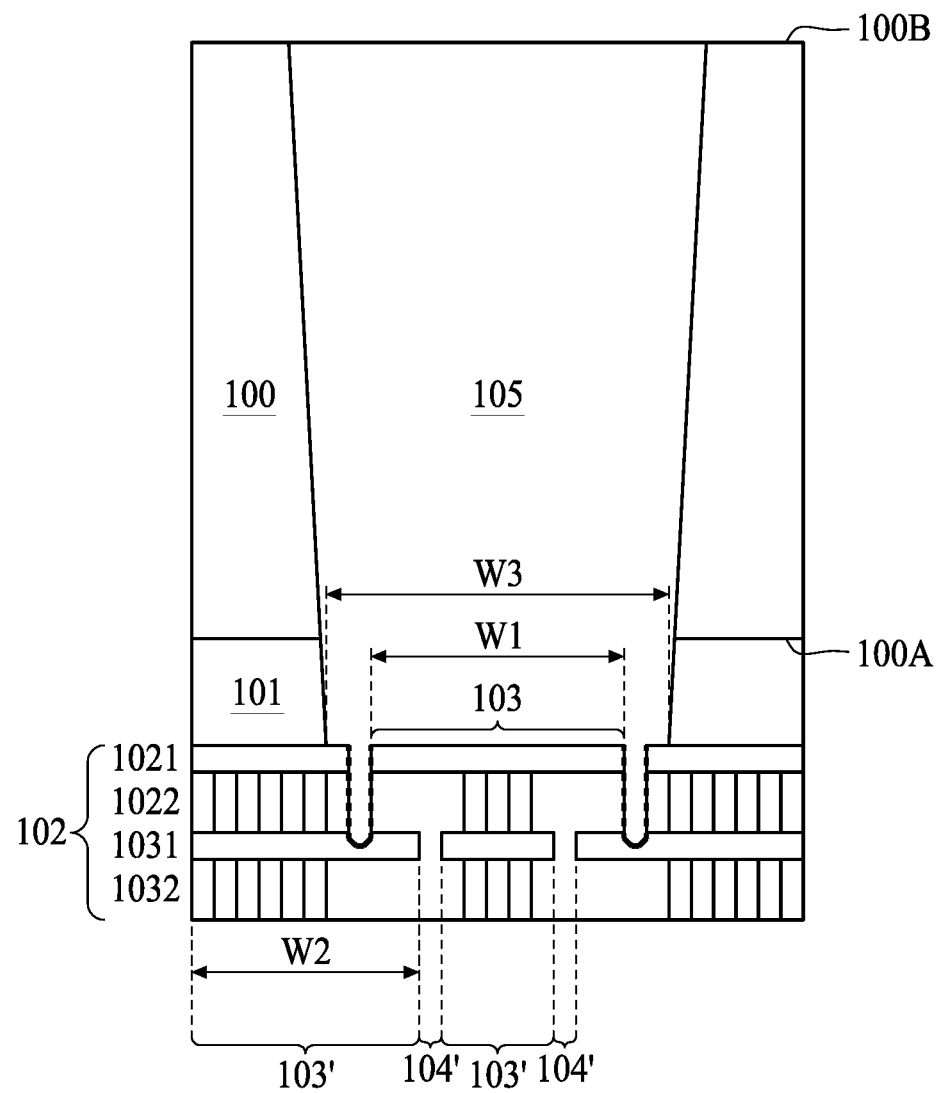
FIG. 2 is a cross sectional view showing an interconnect of a semiconductor structure, in accordance with some embodiments of the present disclosure.

Referring to FIG. 2, FIG. 2 is a cross sectional view showing an interconnect of a semiconductor structure 20, in accordance with some embodiments of the present disclosure. In FIG. 2, the interconnect layer 102 further include a second metal layer 1031 and a second via layer 1032, which are both disposed at the active side 100A of the semiconductor substrate 100A and more distant from the active side 100A than the first 3o metal layer 1021.

With reference to the top view interconnect pattern 60B of the second metal layer 1031 in FIG. 6, a continuous metal feature 103' can be defined by a particular metal area without any interruption, or cutting off, by materials other than metal, for example, dielectrics (interlayer dielectric ILD or inter metal dielectric IMD). The measure of distance in that particular metal area is the dimension of continuous metal feature 103'. As illustrated in FIG. 2 and FIG. 6, starting from an inner portion of the second dielectric feature 104' toward the periphery of the pattern, the continuous metal feature 103' is cut off by an outer portion of the second dielectric feature 104', and a dimension of the continuous metal feature 103' can be a width W2 measured between the inner portion and the outer portion of the second dielectric feature 104'. Referring back to FIG. 2, the dimension W2 of the continuous metal feature 103', in some embodiments, is less than 2 μm as far as technology node N14 is concerned. The dimension of the continuous metal feature is set as a design rule in metal pattern design. Metal layers following this rule shall obtain benefits from various design consideration including appropriate release of stress in the metal layer. As shown in the top view interconnect pattern 60B of the second metal layer 1031 in FIG. 6, the second dielectric feature 104' appears to have a broken band structure. Several metal bridges 1031' are connecting the continuous metal feature 103' inside the inner portion of the second dielectric feature 104' and the continuous metal feature 103' outside the inner portion of the second dielectric feature 104', so on and so forth. Although not shown in the top view pattern 60B, the continuous metal feature inside the inner portion of the second dielectric feature 104' also follows the less than 2 μm design rule as discussed above.

As shown in FIG. 2, the second dielectric feature 104' and the first dielectric feature 104 are disposed staggerly from each other. That is to say, the vertical projection of the first dielectric feature 104 at the first metal layer 1021 is not overlapping with the second dielectric feature 104' at the second metal layer 1031. Such stagger arrangement of the first dielectric feature 104 and the second dielectric feature 104' effectively prevent the first set of tiger tooth 107 from penetrating to metal layers further away from the active side 100A.

Figure 3:
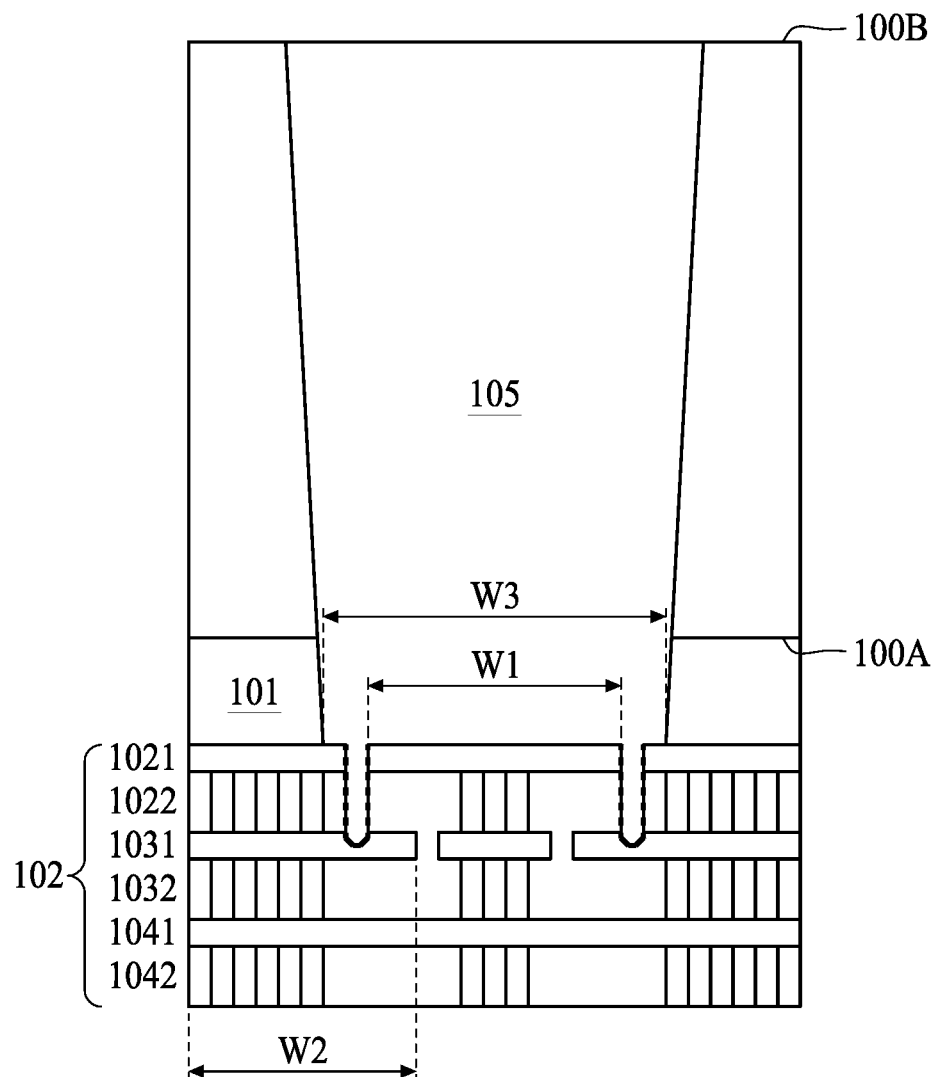
FIG. 3 is a cross sectional view showing an interconnect of a semiconductor structure, in accordance with some embodiments of the present disclosure.

Referring to FIG. 3, FIG. 3 is a cross sectional view showing an interconnect of a semiconductor structure 30, in accordance with some embodiments of the present disclosure. In FIG. 3, the interconnect layer 102 further includes a third metal layer 1041 and a third via layer 1042, which are both disposed at the active side 100A of the semiconductor substrate 100A and more distant from the active side 100A than the second metal layer 1031.

As shown in FIG. 3, the third metal layer 1041 can be a continuous metal feature without any interruption, or cutting off, by the dielectric feature. In the technology node greater than N20, the first metal layer is often adopted a solid metal layer without dielectric patterns. In the technology node N14 and beyond, as discussed herein, the third metal layer 1041 starts adopting the solid metal layer. In addition, a thickness of the third metal layer 1041 can be greater than that of the first metal layer 1021. For example, the thickness of the third metal layer 1041 can be twice as thick as that of the first metal layer 1021. In some embodiments, the third metal layer 1041 does not have to follow the less than 2 μm design rule as discussed above.

Figure 4:
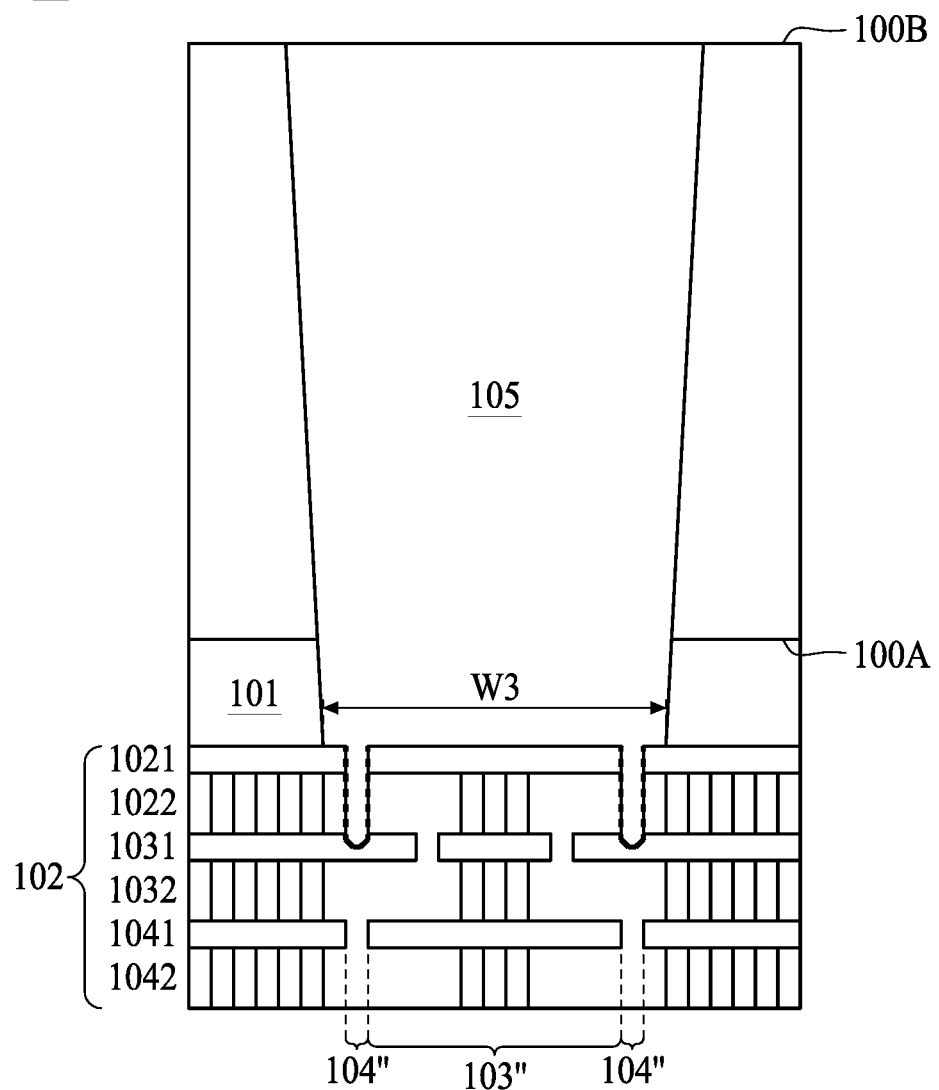
FIG. 4 is a cross sectional view showing an interconnect of a semiconductor structure, in accordance with some embodiments of the present disclosure.

Referring to FIG. 4, FIG. 4 is a cross sectional view showing an interconnect of a semiconductor structure 40, in accordance with some embodiments of the present disclosure. In FIG. 4, the interconnect layer 102 further includes a third metal layer 1041 and a third via layer 1042, which are both disposed at the active side 100A of the semiconductor substrate 100A and more distant from the active side 100A than the second metal layer 1031.

As shown in FIG. 4, the third metal layer 1041 can have a continuous metal feature 103" and a third dielectric feature 104" both identical to that of the continuous metal feature 103 and the first dielectric feature 10 of first metal layer 1021. In addition, the thickness of the third metal layer 1041 can be identical to that of the first metal layer 1021. In some embodiments, the third metal layer 1041 also follow the less than 2 μm design rule as discussed above. Even if the third metal layer 1041 and the first metal layer 1021 share substantially identical continuous metal feature and dielectric feature, those features are both staggerly disposed with respect to the second metal layer 1031 between the first and the third metal layer. Present disclosure provides that the adjacent metal layers would have to apply stagger patterns while non-adjacent metal layers do not have to be limited by this rule.

Figure 5:
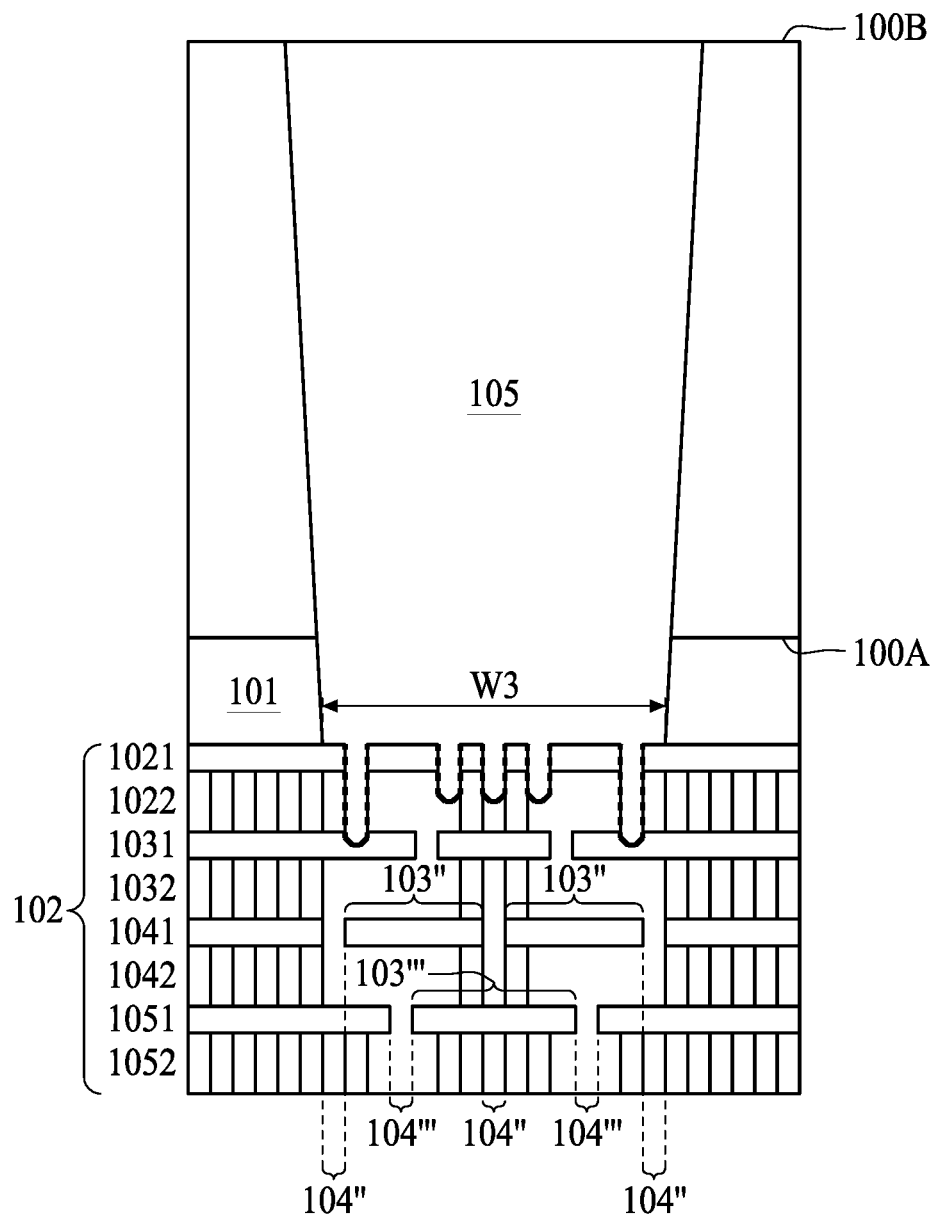
FIG. 5 is a cross sectional view showing an interconnect of a semiconductor structure, in accordance with some embodiments of the present disclosure.

Referring to FIG. 5, FIG. 5 is a cross sectional view showing an interconnect of a semiconductor structure 50, in accordance with some embodiments of the present disclosure. In FIG. 5, the interconnect layer 102 further include a fourth metal layer 1051 and a fourth via layer 1052, which are both disposed at the active side 100A of the semiconductor substrate 100A and more distant from the active side 100A than the third metal layer 1041.

As shown in FIG. 5, the continuous metal feature 103" and the third dielectric feature 104" of the third metal layer 1041 are different from that of the continuous metal feature 103' and the second dielectric feature 104' of second metal layer 1031. In addition, the continuous metal feature 103'" and the third dielectric feature 104'" of the fourth metal layer 1051 are different from those of the third metal layer 1041. In some embodiments, the thickness of the fourth metal layer 1051 can be identical to that of the first metal layer 1021. In some embodiments, the fourth metal layer 1051 also follow the less than 2 μm design rule as discussed above. Although not illustrated in FIG. 5, in some embodiments, the continuous metal feature 103" and the third dielectric feature 104" of the third metal layer 1041 can be substantially identical to those of the first metal layer 1021, and the continuous metal feature 103'" and the fourth dielectric feature 104'" of the fourth metal layer 1051 can be substantially identical to those of the second metal layer 1031. In the present embodiment, a fifth metal layer (not shown) further away from the active side 100A can have a solid metal pattern and a design rule greater than 2 μm as previously discussed.

The less than 2 μm design rule discussed above is made under the premises of technology node N14 and beyond. However, in technology node N7, the design rule for the metal layer could be, for example, less than 0.5 μm. In other words, the dimension of the continuous metal feature in meal layers following the design rule shall be smaller than 0.5 μm as far as technology node N7 is concerned.

Referring to FIG. 6, FIG. 6 is a top view showing two interconnect pattern structures 60A, 60B of two adjacent layers, in accordance with some embodiments of the present disclosure. As previously discussed, interconnect pattern structure 60A is a top view of the first metal layer 1021 as shown in FIG. 1 and FIG. 2, and interconnect pattern structure 60B is a top view of the second metal layer 1021 as shown in FIG. 2. Numeral labels identical to those addressed previously represent substantially identical components and are not repeated here for brevity. Pattern structures 60A and 60B are illustrated with alignment dotted lines showing the first dielectric feature 103 is downwardly projected to a continuous metal feature 103' of the second metal layer 1031. On the other hand, an inner portion and the outer portion of the second dielectric feature 104' are upwardly projected to a continuous metal feature 103 of the first metal layer 1021. The stagger disposition of the first dielectric feature 104 and the second dielectric feature 104' can be clearly observed in FIG. 6. Furthermore, the first via layer 1022 and the second via layer 1032 is also shown from a top view perspective in FIG. 6. As previously discussed, the first dielectric feature 104 and the second dielectric feature 104' possess a broken band.

Figure 7:
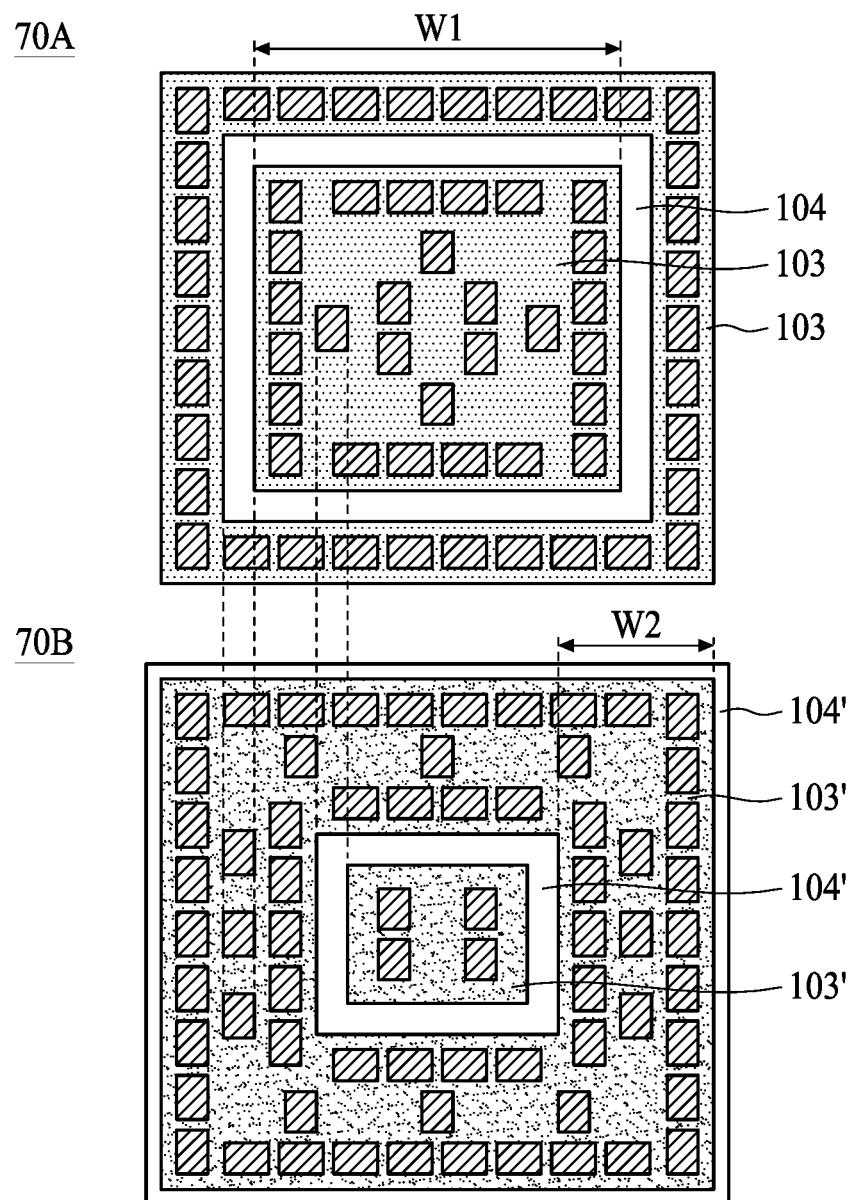
FIG. 7 is atop view showing an interconnect pattern structure of two adjacent layers, in accordance with some embodiments of the present disclosure.

Referring to FIG. 7, FIG. 7 is a top view showing two interconnect pattern structures 70A, 70B of two adjacent layers, in accordance with some embodiments of the present disclosure. As previously discussed, interconnect pattern structure 70A is a top view of the first metal layer 1021 as shown in FIG. 1 and FIG. 2, and interconnect pattern structure 70B is a top view of the second metal layer 1021 as shown in FIG. 2. In some embodiments, the first dielectric feature 104 and the second dielectric feature 104' appear to have a closed band structure. No metal bridge is connecting the continuous metal feature 103 inside the first dielectric feature 104 and the continuous metal feature 103 outside the first dielectric feature 104. Similarly, no metal bridge is connecting the continuous metal feature 103' inside the inner portion of the second dielectric feature 104' and the continuous metal feature 103' outside the inner portion of the second dielectric feature 104'. Pattern structures 70A and 70B are illustrated with alignment dotted lines showing the first dielectric feature 103 is downwardly projected to a continuous metal feature 103' of the second metal layer 1031. On the other hand, an inner portion and the outer portion of the second dielectric feature 104' are upwardly projected to a continuous metal feature 103 of the first metal layer 1021. Although not shown in the top view pattern 60B, the continuous metal feature inside the inner portion of the second dielectric feature 104' also follows the less than 2 μm design rule as discussed above.

Figure 8:
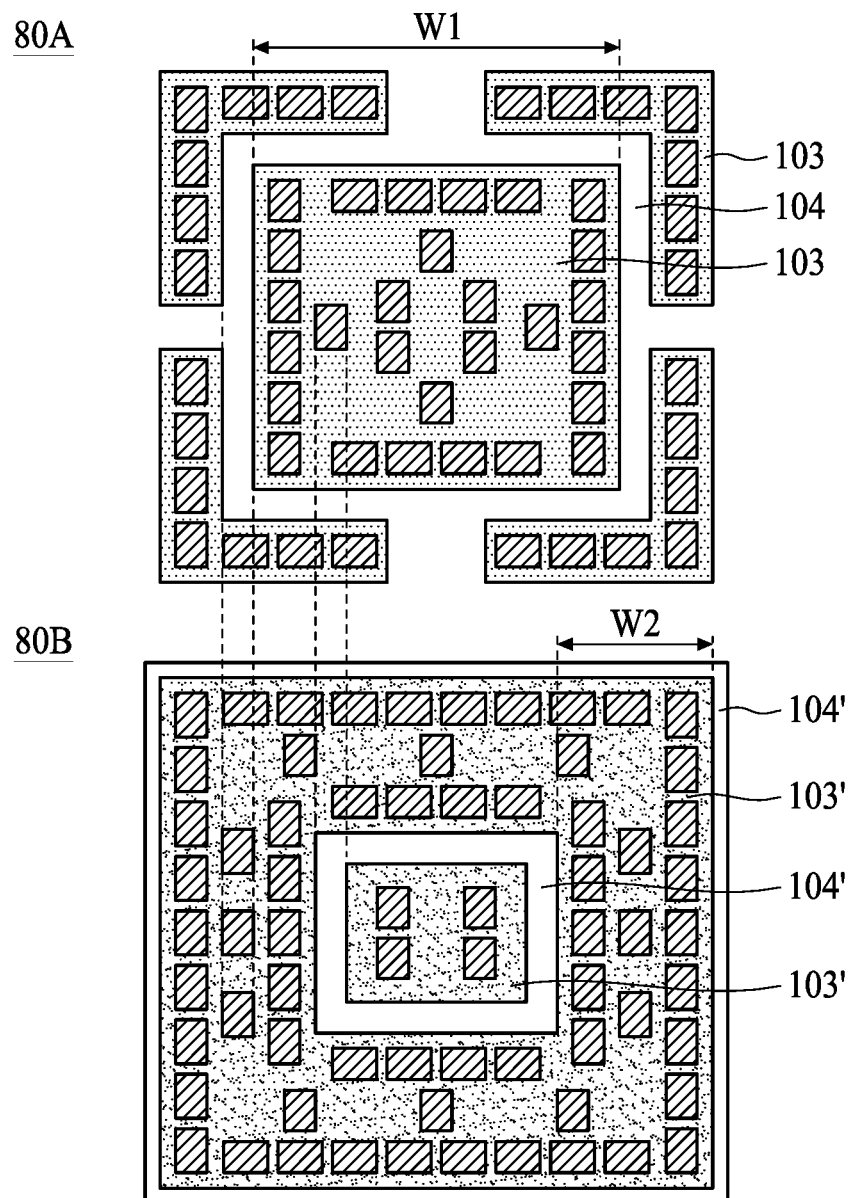
FIG. 8 is a top view showing an interconnect pattern structure of two adjacent layers, in accordance with some embodiments of the present disclosure.

Referring to FIG. 8, FIG. 8 is a top view showing an interconnect pattern structures 80A, 80B of two adjacent layers, in accordance with some embodiments of the present disclosure. As previously discussed, interconnect pattern structure 80A is a top view of the first metal layer 1021 as shown in FIG. 1 and FIG. 2, and interconnect pattern structure 80B is a top view of the second metal layer 1021 as shown in FIG. 2. In some embodiments, the first dielectric feature 104 appears to have an open band structure. Several dielectric bridges are connecting the first dielectric feature 103 to another portion of the first dielectric feature 103 (not shown). However, in order to maintain the stagger feature between adjacent metal layers, the second dielectric feature 104' appears to have a closed band structure. Pattern structures 80A and 80B are illustrated with alignment dotted lines showing the first dielectric feature 103 is downwardly projected to a continuous metal feature 103' of the second metal layer 1031. On the other hand, an inner portion and the outer portion of the second dielectric feature 104' are upwardly projected to a continuous metal feature 103 of the first metal layer 1021.

Figure 9:
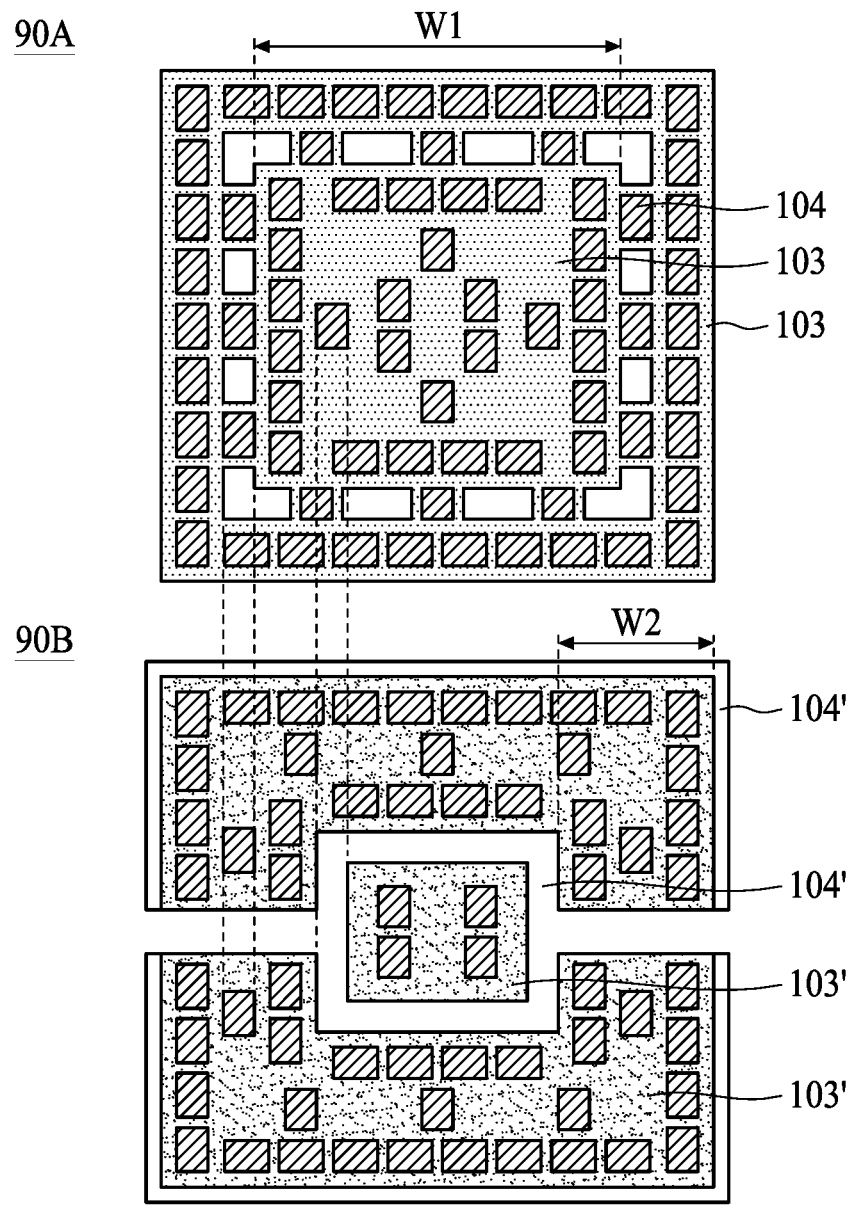
FIG. 9 is a top view showing an interconnect pattern structure of two adjacent layers, in accordance with some embodiments of the present disclosure.

Referring to FIG. 9, FIG. 9 is a top view showing an interconnect pattern structures 90A, 90B of two adjacent layers, in accordance with some embodiments of the present disclosure. As previously discussed, interconnect pattern structure 90A is a top view of the first metal layer 1021 as shown in FIG. 1 and FIG. 2, and interconnect pattern structure 90B is a top view of the second metal layer 1021 as shown in FIG. 2. In some embodiments, the first dielectric feature 104 appears to have a broken band structure. Several metal bridges 1031 are connecting the continuous metal feature 103 inside the first dielectric feature 104 and the continuous metal feature 103 outside the first dielectric feature 104. In order to maintain the stagger feature between adjacent metal layers, the second dielectric feature 104' appears to have an open band structure. Pattern structures 90A and 90B are illustrated with alignment dotted lines showing the first dielectric feature 103 is downwardly projected to a continuous metal feature 103' of the second metal layer 1031. On the other hand, an inner portion and the outer portion of the second dielectric feature 104' are upwardly projected to a continuous metal feature 103 of the first metal layer 1021.

Figure 10:
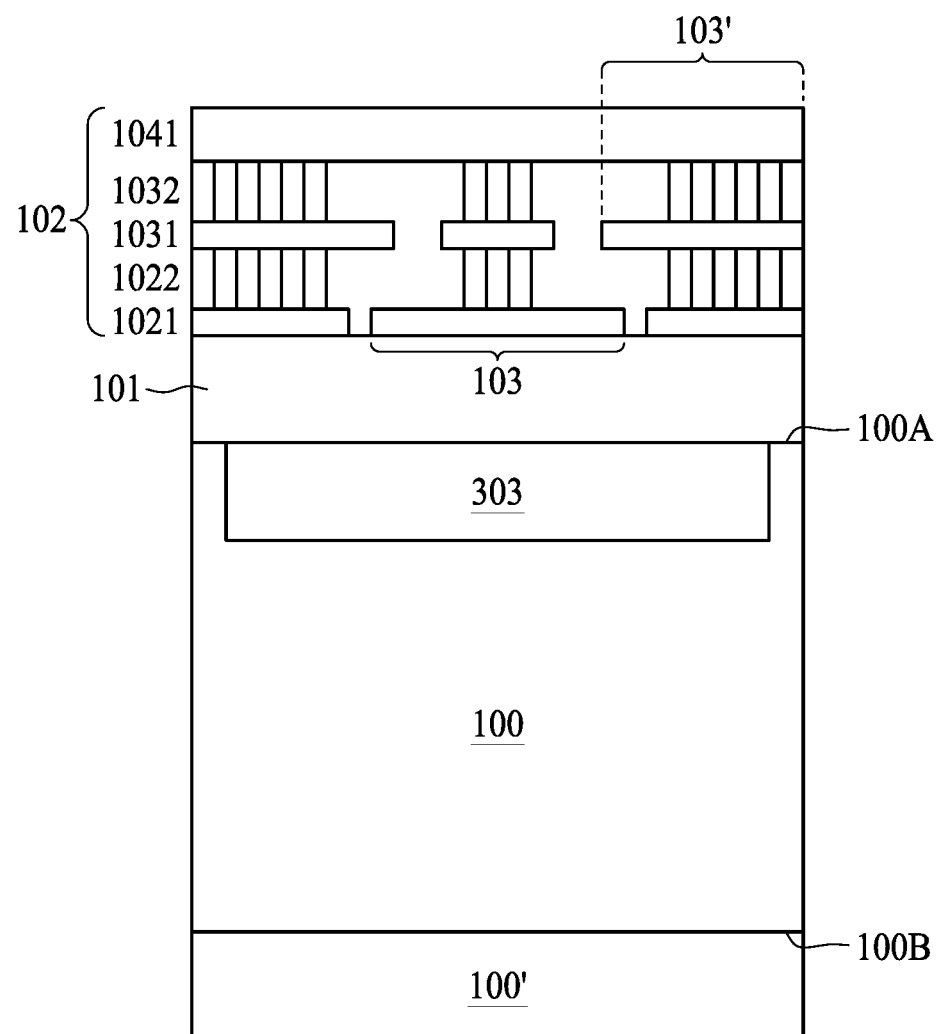
FIG. 10 to FIG. 14 are cross sectional views of a semiconductor structure at various manufacturing operations, in accordance with some embodiments of the present disclosure.

FIG. 10 to FIG. 14 are cross sectional views of a semiconductor structure 30 at various manufacturing operations, in accordance with some embodiments of the present disclosure. In FIG. 10, a semiconductor substrate 100 having an active side 100A and a passive side 100B is received. As previously discussed, active components such as memories or transistors are located in proximity to the active side 100A, an insulating layer 101, such as a shallow trench isolation, for separating different active regions are also formed in the substrate in proximity to the active side 100A. Subsequently, a dielectric layer 101 such as an inter-layer dielectric (ILD) can be formed over the insulating layer 101 and the substrate 100. Over the dielectric layer 101, the interconnect 102 of the device is manufactured with previously discussed patterns of each metal layers. In the embodiment illustrated in FIG. 10, three metal layers and via layers are formed. In some embodiments, the metal layers are a metal feature, such as a metal line, a metal via feature or a metal contact feature.

For example, the first metal layer 1021 is formed by a damascene process, which is further described below. The first dielectric material layer is formed on the dielectric layer 101. Alternatively, an etch stop layer (not shown) is formed on the dielectric layer 101 and the first dielectric material layer is formed on the etch stop layer. In some embodiments, the first dielectric material layer includes a dielectric material such as silicon oxide, silicon nitride, a low dielectric constant (low k) material, or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SiLK (Dow Chemical. Midland. Mich.), polyimide, porous polymer and/or other suitable materials as examples. A process of forming the first dielectric material layer may utilize chemical vapor deposition (CVD), a spin-on coating or other suitable deposition technology. The etch stop layer includes a material different from the first dielectric material layer designed to provide etch selectivity such that a subsequent etching process is able to substantially etch the first dielectric material layer and stops on the etch stop layer. For example, the etch stop layer includes silicon nitride, silicon oxide, silicon oxynitride, silicon carbide or other suitable material that functions to stop the etching of the subsequent etching process. The etch stop layer may be formed by CVD or other suitable technology. After the deposition of (the etch stop layer and) the first dielectric material layer, the first dielectric material layer may be further planarized by a technique, such as chemical mechanical polishing (CMP).

Thereafter, a mask layer (not shown) for the first metal layer 1021 is patterned by a lithography process, thereby forming a patterned mask layer having one (or more) opening to define a region (or regions) for metal line (or metal lines), as illustrated in FIGS. 6-9. In some embodiments, the opening of the patterned mask layer corresponds to the locations of the continuous metal feature 103 in the first metal layer 1021, and the covered region of the patterned mask layer corresponds to the locations of the first dielectric feature 104 in the first metal layer 1021. The metal line refers to a metal line in an upper metal layer to be formed. In some embodiments, the mask layer is a resist layer, the patterning process is a lithography procedure that includes spin-on coating, exposure and developing. In some embodiments, the mask layer is a hard mask, the patterning process includes forming a patterned resist layer on the hard mask using a lithography process; and etching the hard mask through the opening of the patterned resist layer using the patterned resist layer as an etch mask. After the formation of the patterned hard mask, the patterned resist layer may be removed by plasma ashing or wet stripping.

The formation of the first via layer 1022 can be referring to previously discussed section regarding the formation of the first metal layer 1021 and is not repeated here for brevity. Of course, the patterning of the first via layer 1022 changes correspondingly with the pattern of the first metal layer 1021. The formation of the second metal layer 1031 can be referring to previously discussed section regarding the formation of the first metal layer 1021 and is not repeated here for brevity. The pattern of the second metal layer 1031 includes a continuous metal feature 103' and a second dielectric feature 104', as previously described. The first dielectric feature 104 in the first metal layer 1021 is designed to dispose staggerly from the second dielectric feature 104' in the second metal layer 1031. Furthermore, in FIG. 10, the formation of the third metal layer 1041 can be referring to previously discussed section regarding the formation of the first metal layer 1021 and is not repeated here for brevity. In some embodiments, the third metal layer 1041 can be a continuous metal feature without any interruption, or cutting off, by the dielectric feature.

In some embodiments, the substrate 100 may be then thinned from a passive side 100B through known techniques, such as back grinding, etching, CMP, or the like, and a thick passivation layer 100', for example, an oxide layer, is formed over the thinned surface on the passive side 100B.

Figure 11:
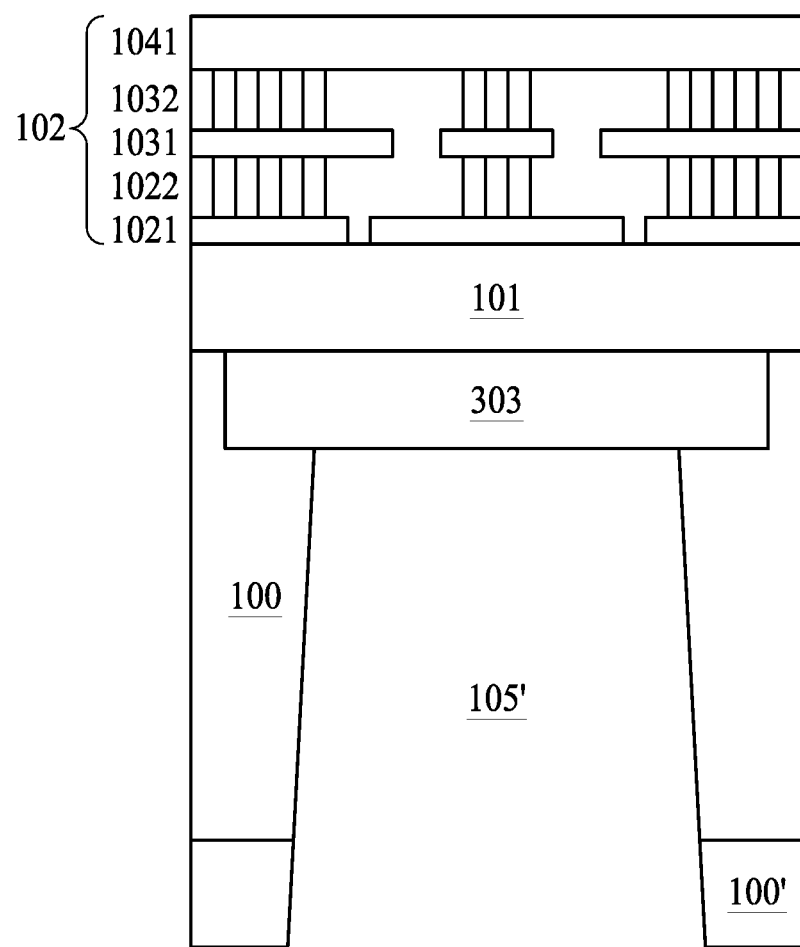

In FIG. 11, a through substrate via (TSV) recess 105' is partially formed from the passive side 100B of the substrate 100 via a first etching operation. The first etching operation removes the substrate 100 from the passive side 100B until the insulating layer 303 is reached. In some embodiments, the first etching operation utilize an etching chemistry suitable for removing substrate materials. TSV recesses 105' are formed after the CMOS device formations in proximity to the active side 100A of the substrate 100 and after the metallization process of forming metal layers, for example, at least M1-M3, in the interconnect layer 102. In an IC fabricated with advanced processing technology, inter-metal dielectric (IMD) layers 1013 are typically formed with dielectric materials having low dielectric constant (low-k) or extremely low dielectric constant in an effort to reduce inter-metal layer parasitic capacitance, thus increasing signal speed and enhance signal integrity. As an example, a low-k dielectric material has a dielectric constant less than 2.9, and is formed with a porous organic dielectric material.

Figure 12:
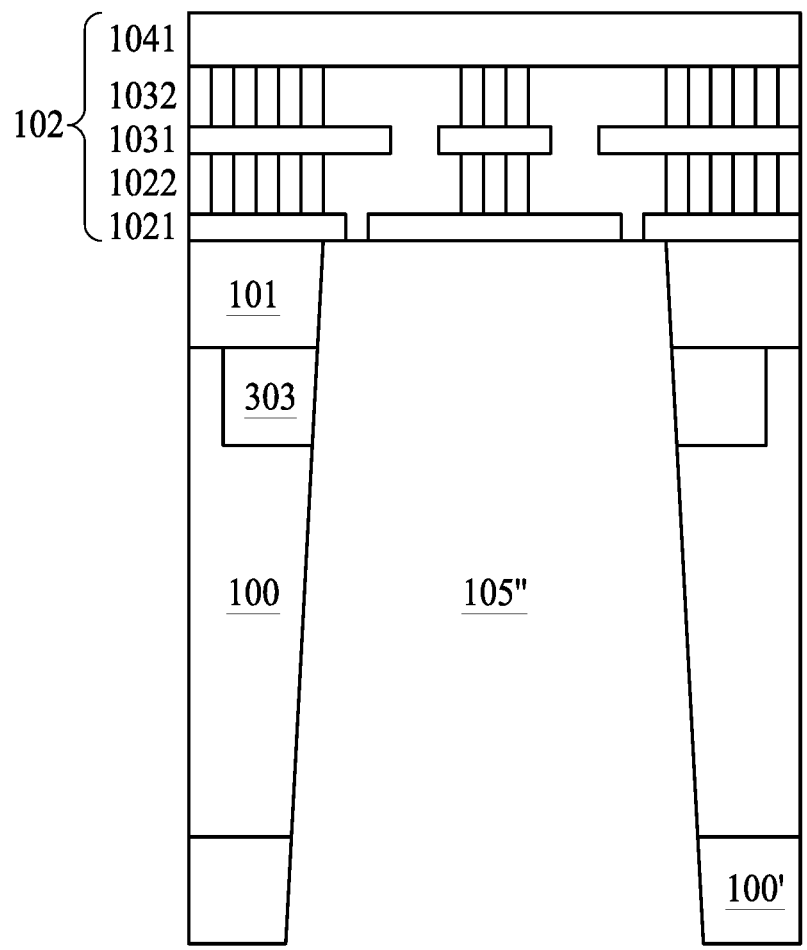

In FIG. 12, a through substrate via (TSV) recess 105" is completely formed from the passive side 100B of the substrate 100 via a second etching operation. The second etching operation removes the remaining insulating layer 303, the dielectric layer 303, and until the first metal layer 1021 is reached. In some embodiments, the second etching operation utilizes an etching chemistry different from that of the first etching operation, for example, the second etching operation utilizes chemistry suitable for removing dielectric materials. It is the ability to control the second etching that determines the tiger tooth formation. For instance, if the second etching is considered over-etch, it is likely that the IMD layer 1013 at first metal layer 1021 level and the first via layer 1022 being removed by the etchant, providing a tiger tooth pocket for the subsequent metallic materials to fill. The IMD layer 1013 at first metal layer 1021 level corresponds to the first dielectric feature 104 as previously discussed.

This TSV recess 105" formation process creates a number of problems in advanced processing technologies. One of the problems is that the formation of the TSV recesses 105" in the inter-metal dielectric layers typically involves multiple etch processes; the wafers under processing often stand in queue for the various etch process to be completed. During processing, moisture or other chemical agents in a wafer processing facility may leach into the low-k inter-metal dielectric layers from the side wall of the TSV recesses and diffuse throughout the inter-metal dielectric layers, which may lead to undesired characteristic change of the low-k dielectric materials. Due to the large exposed surface area of the TSV recesses, this detrimental effect can be significant and cause serious device performance degradation and yield loss. The first and the second etching provided here provides a method to reduce the characteristic change of the IMD layer 1013 by exposing the low-k IMD layer 1013 in the last etching operation of TSV recess 105" formation.

The TSV recesses 105" formed in the IMD layers and in the substrate 100 are subsequently filled with conductive metallic materials by a metallization process, such as a metallic chemical vapor deposition process (CVD) or a metal electroplating process. Metallization process, such as metallic CVD or metal plating, may be subsequently performed on the passive side 100B of the substrate 100, filling copper (Cu) or the suitable conductive materials in the TSV recesses 105" to form TSVs 105 in substrate 100. Other suitable conductive materials, such as aluminum (Al), tungsten (W), cobalt (Co), gold (Au), silver (Ag), platinum (Pt), silicon (Si) and other suitable deposition processes may be also used to form TSVs 105.

Figure 13:
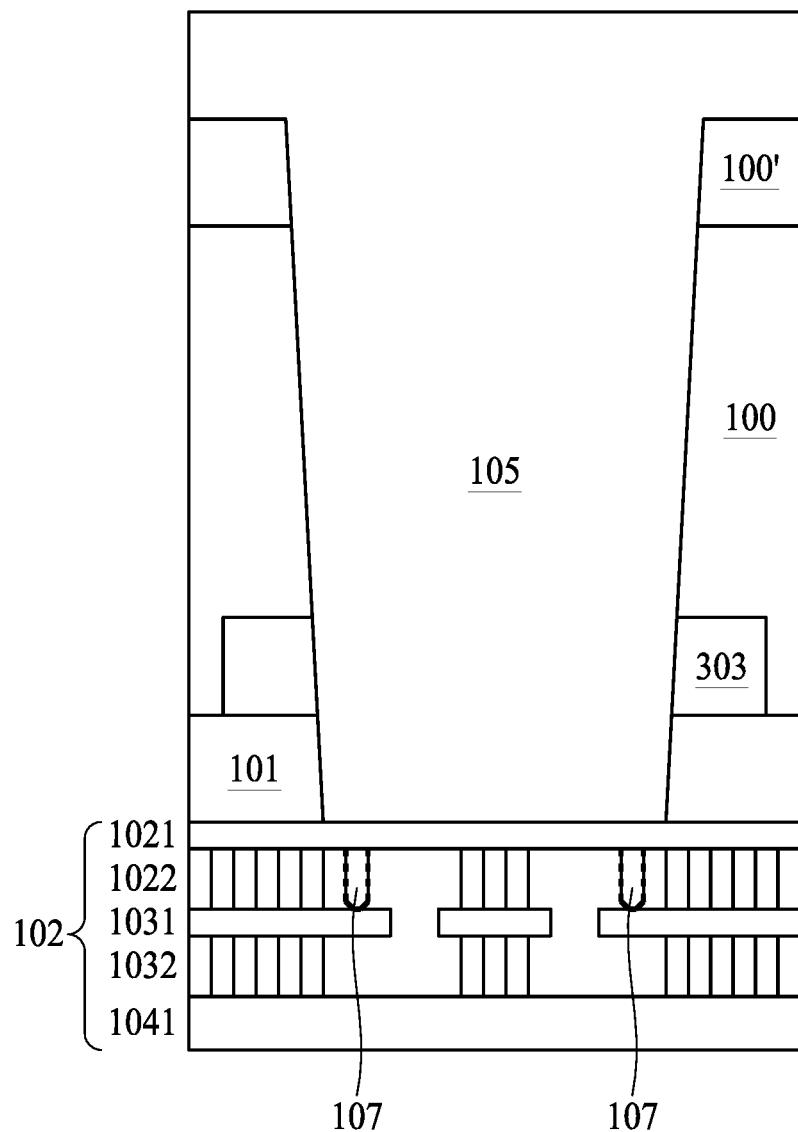

In FIG. 13, a CMP operation may be performed afterwards on the passive side 100B of the substrate 100 to remove excess TSV materials and provide the desired flat substrate surface for the subsequent processing operations. Optionally, a barrier layer, such as a titanium nitride (TiN) layer and/or a metal seed layer (not shown), may be formed conformally in the TSV recesses 105" by suitable processes, such as CVD or physical vapor deposition (PVD), prior to the metallization process of forming TSVs 105. A barrier layer in TSV recesses 105" may prevent any conducting TSV material from leaching into any active portions of the circuitry at the active side 100A of the substrate 100. Also shown in FIG. 13, the first set of tiger tooth 107 are illustrated with dotted lines to show the possible locations, and how the second metal layer 1031 can effectively prevent the first set of tiger tooth 107 from further penetration toward higher metal layers.

Figure 14:
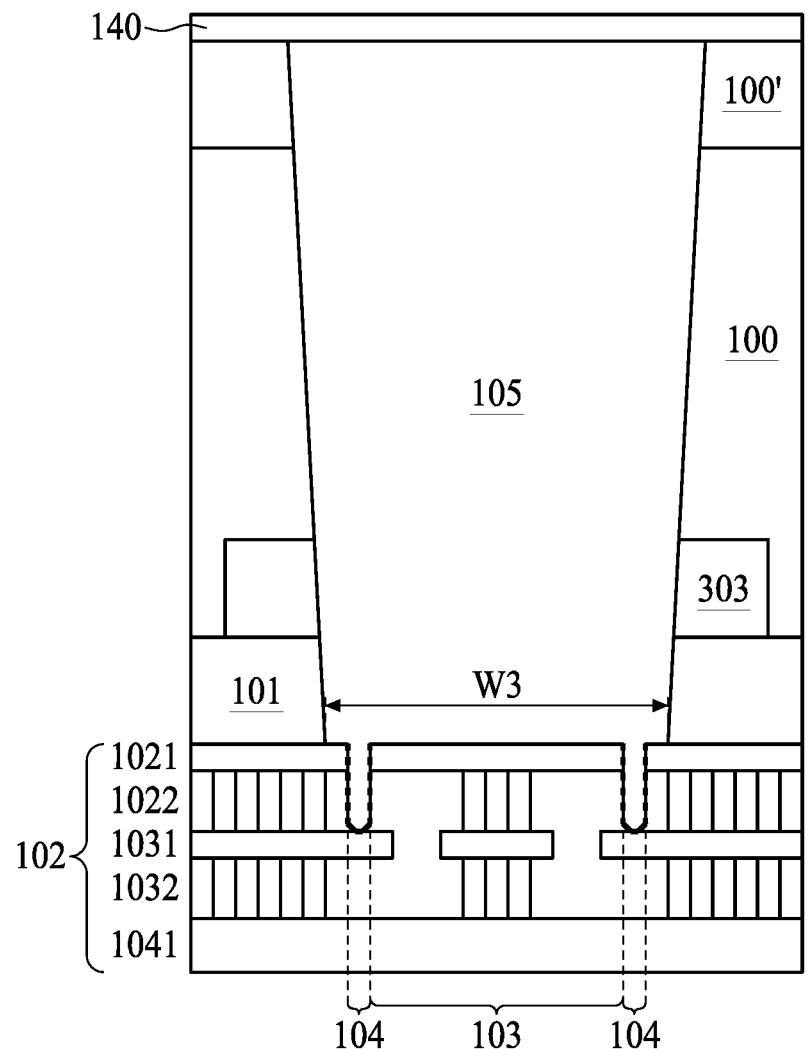

In FIG. 14, passive side 100B of the substrate 100 may be further processed to form insulating layer 116, dielectric layer (not shown), conductive interface (not shown), bonding pads (not shown) with similar materials and processing techniques used for the similar features formed previously over the active side 100A of the substrate 100. Substrate 100 thus processed may be bonded to other integrated circuit wafers and dies from both sides. Also shown in FIG. 14, after the metallization process, a width W3 of the TSV 105 in proximity to the first metal layer 1021 is greater than a dimension of the first dielectric feature 104 of the first metal layer 1021. Since the "tiger tooth" via punch through is no longer a problem, the process windows for forming the TSVs 105 can be relaxed, and the device performance may be improved as well.

Some embodiments provide a semiconductor structure, including a semiconductor substrate, a first metal layer, and a through substrate via (TSV). The semiconductor substrate has an active side. The first metal layer is closest to the active side of the semiconductor substrate, and the first metal layer has a first continuous metal feature. The TSV is extending from the semiconductor substrate to the first continuous metal feature. A width of the TSV at the first metal layer is wider than a width of the first continuous metal feature.

Some embodiments provide an interconnect pattern structure, including a first metal layer, a second metal layer, and a through substrate via (TSV). The first metal layer has a first continuous metal feature. The second metal layer is over the first metal layer, and has a second continuous metal feature. The TSV is extending from the semiconductor substrate toward the first metal layer and in contact with the first continuous metal feature. The TSV includes a first set of tiger tooth. The first set of tiger tooth penetrates from the semiconductor substrate toward the second metal layer through the first metal layer.

Some embodiments provide a method for manufacturing a semiconductor structure. The method includes the following steps: receiving a semiconductor substrate having an active side; forming a first metal layer closest to the active side of the semiconductor substrate; and forming a through substrate via (TSV) extending from the semiconductor substrate to the first metal layer. Forming the TSV includes forming a tiger tooth penetrating the first metal layer, in which the tiger tooth is a continuous portion of the TSV.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
 a semiconductor substrate having an active side;
 a first metal layer closest to the active side of the semiconductor substrate, the first metal layer having a first continuous metal feature;

a second metal layer at the active side of the semiconductor substrate and more distant from the active side than the first metal layer; and a through substrate via (TSV) extending from the semiconductor substrate to the first continuous metal feature, a width of the TSV at the first metal layer being wider than a width of the first continuous metal feature, wherein the first metal layer has a first dielectric feature in contact with the TSV, wherein the first continuous metal feature is cut off by the first dielectric feature, and wherein the second metal layer has a second dielectric feature and a second continuous metal feature, wherein the second continuous metal feature is cut off by the second dielectric feature from a top view perspective, and the second dielectric feature is free from contacting with the TSV.

2. The semiconductor structure of claim 1, wherein the TSV is in contact with the first continuous metal feature.

3. The semiconductor structure of claim 1, the second dielectric feature comprises an inner portion and an outer portion.

4. The semiconductor structure of claim 1, wherein the second dielectric feature is not overlapped with the first dielectric feature from the top view perspective.

5. The semiconductor structure of claim 1, further comprising a third metal layer at the active side of the semiconductor substrate and more distant from the active side than the second metal layer, wherein the third metal layer has a third dielectric feature and a third continuous metal feature, wherein the third continuous metal feature is cut off by the third dielectric feature from the top view perspective, and the third dielectric feature is overlapped with the first dielectric feature.

6. The semiconductor structure of claim 1, further comprising a tiger tooth structure extending from the TSV to the second metal layer through the first dielectric feature.

7. An interconnect pattern structure, comprising:
a first metal layer having a first continuous metal feature;
a second metal layer over the first metal layer, having a second continuous metal feature; and
a through substrate via (TSV) extending from the semiconductor substrate toward the first metal layer and in contact with the first continuous metal feature, wherein the TSV comprises:
a first set of tiger tooth penetrating from the semiconductor substrate toward the second metal layer through the first metal layer,
wherein the first continuous metal feature is cut off by a first dielectric feature of the first metal layer, wherein the first dielectric feature is in contact with the TSV, and
wherein the second continuous metal feature is cut off by a second dielectric feature, wherein the second dielectric feature is free from contacting with the TSV.

8. The interconnect pattern structure of claim 7, wherein the first set of tiger tooth is free from overlapping with the second dielectric feature.

9. The interconnect pattern structure of claim 8, wherein the first dielectric feature comprises a closed band.

10. The interconnect pattern structure of claim 8, wherein the first dielectric feature comprises an open band.

11. The interconnect pattern structure of claim 8, wherein the first dielectric feature is staggered from the second dielectric feature from a top view perspective.

12. The interconnect pattern structure of claim 8, further comprising:

a third metal layer over the second metal layer, wherein the third metal layer has a third continuous metal feature cutting off by a third dielectric feature; and
a fourth metal layer over the third metal layer, wherein the fourth metal layer has a fourth continuous metal feature cutting off by a fourth dielectric feature,
wherein the third dielectric feature being disposed staggerly from the second dielectric feature, and the fourth dielectric feature being disposed staggerly from the third dielectric feature.

13. The interconnect pattern structure of claim 7, further comprising a via layer disposed between the first metal layer and the second metal layer, wherein the via layer is free from overlapping with the first set of tiger tooth.

14. The interconnect pattern structure of claim 7, wherein a width of the TSV at the first continuous metal feature is wider than a width of the first continuous metal feature.

15. A method for manufacturing a semiconductor structure, comprising:
receiving a semiconductor substrate having an active side;
forming a first metal layer closest to the active side of the semiconductor substrate, wherein the first metal layer has a first dielectric feature and a first continuous metal feature, wherein the first continuous metal feature is cut off by the first dielectric feature;
forming a second metal layer at the active side of the semiconductor substrate and more distant from the active side than the first metal layer, wherein the second metal layer has a second dielectric feature and a second continuous metal feature, wherein the second continuous metal feature is cut off by the second dielectric feature from a top view perspective; and
forming a through substrate via (TSV) extending from the semiconductor substrate to the first metal layer, wherein forming the TSV comprises:
forming a tiger tooth penetrating the first metal layer, wherein the tiger tooth is a continuous portion of the TSV, wherein the tiger tooth is formed in contact with a first dielectric feature and free from contacting with the second dielectric feature.

16. The method of claim 15, wherein forming the TSV comprises:
performing a first etching from a passive side of the semiconductor substrate until reaching an insulating layer in proximity to the active side, the passive side being opposite to the active side; and
performing a second etching from the insulating layer until reaching the first metal layer thereby forming a TSV trench.

17. The method of claim 16, wherein the TSV trench exposes the first metal layer and the first dielectric feature of the first metal layer, wherein the tiger tooth is formed at and penetrates the first dielectric feature.

18. The method of claim 15, wherein forming the first metal layer comprises forming the first dielectric feature cutting off the first continuous metal feature of the first metal layer, wherein the TSV is in contact with the first continuous metal feature, wherein a width of the TSV at the first metal layer is wider than a width of the first continuous metal feature.

19. The semiconductor structure of claim 1, wherein first dielectric feature is an open band from the top view pwespective.

20. The semiconductor structure of claim 1, wherein first dielectric feature is a close band from the top view pwespective.

* * * * *